United States Patent
Saggio et al.

(10) Patent No.: US 9,711,599 B2
(45) Date of Patent: Jul. 18, 2017

(54) WIDE BANDGAP HIGH-DENSITY SEMICONDUCTOR SWITCHING DEVICE AND MANUFACTURING PROCESS THEREOF

(71) Applicant: STMICROELECTRONICS S.R.L., Agrate Brianza (IT)

(72) Inventors: Mario Giuseppe Saggio, Aci Bonaccorsi (IT); Simone Rascuna, San Giovanni la Punta (IT); Fabrizio Roccaforte, Mascalucia (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 14/735,679

(22) Filed: Jun. 10, 2015

(65) Prior Publication Data
US 2015/0372093 A1 Dec. 24, 2015

(30) Foreign Application Priority Data

Jun. 20, 2014 (IT) .............................. TO2014A0494

(51) Int. Cl.
*H01L 29/66* (2006.01)
*H01L 29/45* (2006.01)
(Continued)

(52) U.S. Cl.
CPC ........ *H01L 29/1608* (2013.01); *H01L 21/046* (2013.01); *H01L 21/0485* (2013.01);
(Continued)

(58) Field of Classification Search
CPC ....... H01L 21/283; H01L 29/45; H01L 29/47; H01L 29/861; H01L 21/046;
(Continued)

(56) References Cited

U.S. PATENT DOCUMENTS

| 7,777,257 B2 * | 8/2010 | Khemka | H01L 29/0634 257/260 |
| 2002/0125482 A1 | 9/2002 | Friedrichs et al. | |

(Continued)

FOREIGN PATENT DOCUMENTS

| JP | 2002-314099 A | 10/2002 |
| WO | 2013/145545 A1 | 10/2013 |

OTHER PUBLICATIONS

Shannon, J. M., "Reducing the effective height of a Schottky barrier using low-energy ion implantation," Appl. Phys. Lett. 24(8):369-371, Apr. 15, 1974.
(Continued)

*Primary Examiner* — Fazli Erdem
(74) *Attorney, Agent, or Firm* — Seed Intellectual Property Law Group LLP

(57) ABSTRACT

A switching device, such as a barrier junction Schottky diode, has a body of silicon carbide of a first conductivity type housing switching regions of a second conductivity type. The switching regions extend from a top surface of the body and delimit body surface portions between them. A contact metal layer having homogeneous chemical-physical characteristics extends on and in direct contact with the top surface of the body and forms Schottky contact metal portions with the surface portions of the body and ohmic contact metal portions with the switching regions. The contact metal layer is formed by depositing a nickel or cobalt layer on the body and carrying out a thermal treatment so that the metal reacts with the semiconductor material of the body and forms a silicide.

20 Claims, 6 Drawing Sheets

(51) Int. Cl.
  *H01L 29/16* (2006.01)
  *H01L 29/872* (2006.01)
  *H01L 29/417* (2006.01)
  *H01L 21/04* (2006.01)
  *H01L 29/47* (2006.01)
  *H01L 29/06* (2006.01)
  *H01L 29/861* (2006.01)

(52) U.S. Cl.
  CPC ...... *H01L 21/0495* (2013.01); *H01L 29/0696* (2013.01); *H01L 29/417* (2013.01); *H01L 29/45* (2013.01); *H01L 29/47* (2013.01); *H01L 29/6606* (2013.01); *H01L 29/66143* (2013.01); *H01L 29/8611* (2013.01); *H01L 29/872* (2013.01)

(58) Field of Classification Search
  CPC ............. H01L 21/0485; H01L 21/0495; H01L 29/1608; H01L 29/0696; H01L 29/417; H01L 29/6606; H01L 29/66143; H01L 29/8611; H01L 29/872; H01L 29/16; H01L 29/66; H01L 29/06
  See application file for complete search history.

(56) References Cited

U.S. PATENT DOCUMENTS

| | | | |
|---|---|---|---|
| 2003/0020133 A1* | 1/2003 | Dahlqvist | H01L 27/0814 257/471 |
| 2003/0178672 A1* | 9/2003 | Hatakeyama | H01L 29/0615 257/328 |
| 2007/0228505 A1* | 10/2007 | Mazzola | H01L 29/8611 257/471 |
| 2008/0277669 A1 | 11/2008 | Okuno et al. | |
| 2009/0209090 A1 | 8/2009 | Yokoyama et al. | |
| 2009/0289262 A1* | 11/2009 | Zhang | H01L 29/0615 257/77 |
| 2009/0294859 A1 | 12/2009 | Hshieh | |
| 2011/0248285 A1 | 10/2011 | Zhang et al. | |
| 2012/0018836 A1* | 1/2012 | Nagai | H01L 29/0619 257/471 |
| 2012/0049940 A1* | 3/2012 | Frisina | H01L 21/046 327/539 |
| 2012/0187521 A1* | 7/2012 | Qu | H01L 29/872 257/476 |
| 2012/0241897 A1* | 9/2012 | Qu | H01L 29/0619 257/475 |
| 2012/0256196 A1* | 10/2012 | Qu | H01L 29/8611 257/77 |
| 2012/0267748 A1* | 10/2012 | Suzuki | H01L 29/872 257/471 |
| 2013/0140585 A1* | 6/2013 | Mazzola | H01L 29/872 257/77 |
| 2013/0244428 A1 | 9/2013 | Ohno | |
| 2013/0313635 A1* | 11/2013 | Nakano | H01L 21/8213 257/330 |
| 2014/0035090 A1* | 2/2014 | Qu | H01L 29/36 257/475 |
| 2015/0001667 A1* | 1/2015 | Matsuzaki | H01L 29/872 257/471 |
| 2015/0028445 A1* | 1/2015 | Qu | H01L 29/861 257/483 |
| 2015/0091125 A1* | 4/2015 | Goerlach | H01L 29/66143 257/474 |

OTHER PUBLICATIONS

STPSC6H12—1200 V power Schottky silicon carbide diode, Datasheet—production data, Rev. 3, STMicroelectronics, 8 pages, Mar. 2015.

* cited by examiner

WIDE BANDGAP HIGH-DENSITY SEMICONDUCTOR SWITCHING DEVICE AND MANUFACTURING PROCESS THEREOF

BACKGROUND

Technical Field

The present disclosure relates to a wide bandgap (WBG) high-density semiconductor switching device and the manufacturing process thereof. More in particular, reference will be made hereinafter to a high voltage power WBG diode.

Description of the Related Art

On the market, switching devices called JBS (junction-barrier Schottky) diodes or MPS (merged PiN Schottky) diodes have recently been proposed. These devices are generally made in silicon-carbide (SiC) substrates and comprise implanted areas with an opposite conductivity to the substrate (e.g., of a P type, for a substrate of an N type). These devices have two distinct types of contacts: an ohmic contact at the implanted areas and a Schottky contact in the areas comprised between the implanted ones.

The above characteristics render the JBS diodes particularly suitable for working in high voltage power devices.

The presence of the ohmic contacts at the implanted areas may, however, cause criticalities in the alignment and may limit the ohmic contact area, also depending upon the quality of alignment of the photo-exposure equipment used. This limits packing of the structure and development of more advanced diodes.

BRIEF SUMMARY

The aim of the present disclosure is to provide a device and a manufacturing process overcoming the drawbacks of the prior art.

According to the present disclosure, a wide bandgap semiconductor switching device and the manufacturing process thereof are provided, as defined in claims 1 and 9.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
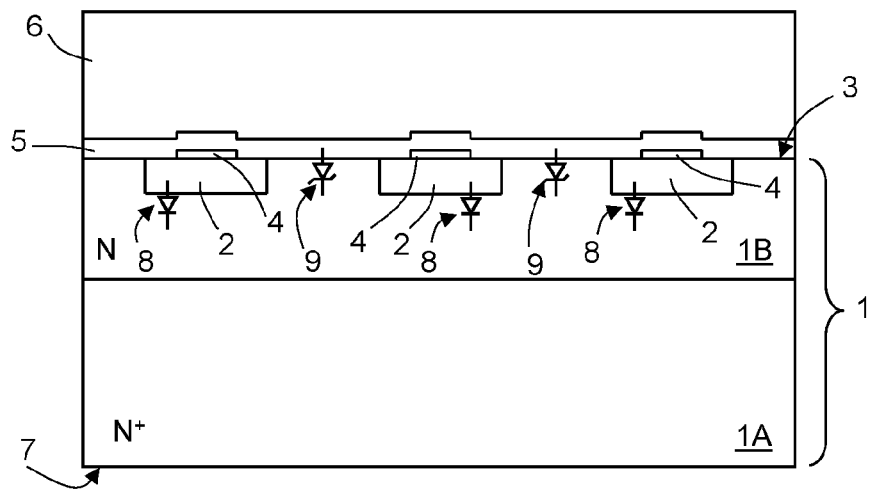
FIG. 1 is a cross-section of the basic physical structure of a semiconductor device including a known JBS diode.

FIG. 1 is a schematic illustration of the structure of a JBS diode. Here a body 1 of silicon carbide, generally of an N type, has a first surface 3 and a second surface 7. The substrate 1 is formed by a low resistivity substrate 1A of an N+ type and an epitaxial layer 1B of an N type. For instance, the substrate 1A has a thickness comprised between 40 μm and 500 μm, typically 350 μm, and a resistivity comprised between 10 and 30 mΩ·cm, typically 20 mΩ·cm; the epitaxial layer 1B has a thickness comprised between 3 μm and 15 μm and a doping level comprised between $10^{15}$ and $5·10^{16}$. The epitaxial layer 1B houses implanted areas 2 of a P type, facing the first surface 3 of the body 1. Ohmic contact regions 4, of metal, extend over the implanted regions 2, on the first surface 3. A first metal layer 5, thinner, extends over the epitaxial layer 1B and the ohmic contact regions 4 and forms, at the implanted areas 2, a Schottky contact. A second metal layer 6, which is thicker than the first metal layer 5, extends over the first metal layer 5.

In top plan view, the implanted regions 2 may be strip-shaped, extending longitudinally and perpendicular to the drawing plane, or have any other shape, for example according to the sides of regular or irregular geometrical figures, such as squares, rectangles, hexagons, circles, etc.

Figure 2A:
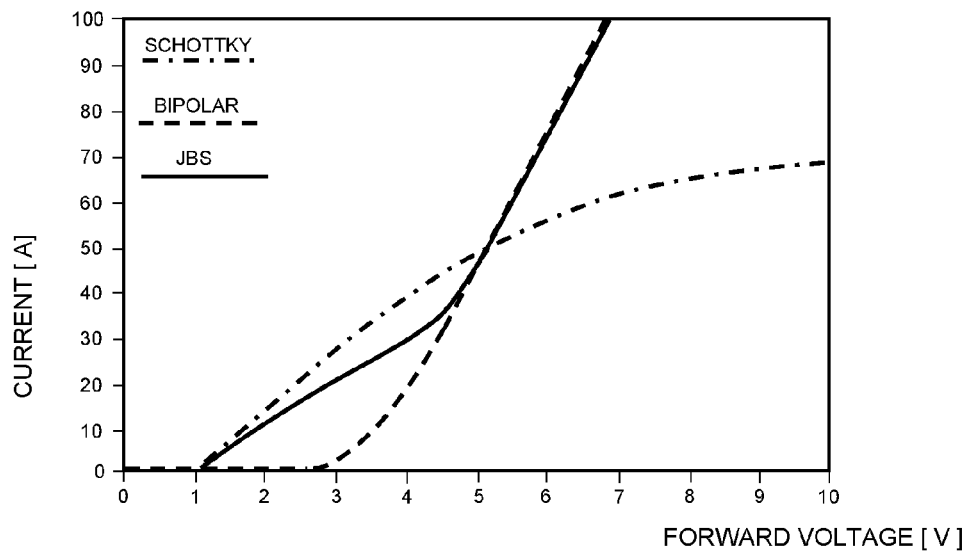
FIGS. 2A and 2B show the current plot as a function of the forward and reverse voltage in three different switching devices.
Figure 2B:
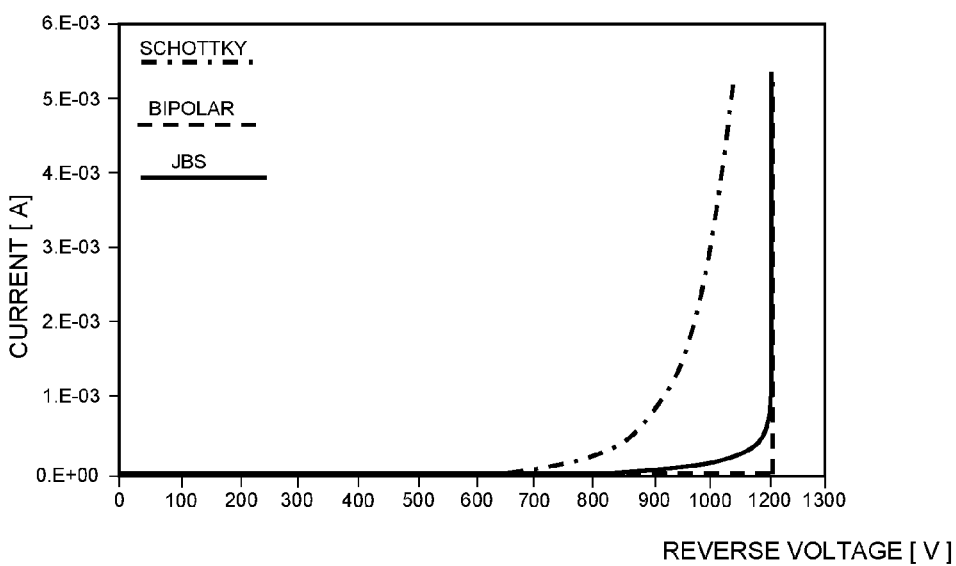

In this structure, the body 1 and the implanted regions 2 form, respectively, cathode regions and anode regions of bipolar diodes (designated as a whole at 8 in FIG. 1), whereas the metal layers 5 and 6 and the body 1 form, respectively, anode regions and cathode regions of Schottky diodes (designated as a whole at 9 in FIG. 1). The metal layers 5 and 6 further parallel connect the bipolar diode 8 with the Schottky diode 9. Experimental characteristics of JBS devices as compared to similar devices integrated in silicon-carbide substrates using bipolar and purely Schottky technology are shown, for example, in FIGS. 2A and 2B which represent, respectively, the characteristics of forward and reverse conduction (leakage current) of these diodes.

As is known, the JBS device enables, at the operating current (in the case of the example, 6 A), the same forward voltage drop as the Schottky diode and a leakage current comparable to that of the bipolar diode, near the breakdown voltage. The presence of a good ohmic contact in the JBS structure further enables the JBS device, when forward biased, to withstand high currents, by triggering the bipolar junction; namely, the diode has a high IFSM (non-repetitive forward surge current max), i.e., a high maximum forward current that it can withstand (without failure) in presence of a pulse of a sinusoidal shape.

The JBS diode of FIG. 1 may be obtained, for example, as shown in FIGS. 3A-3H and described in detail hereinafter.

Figure 3A:
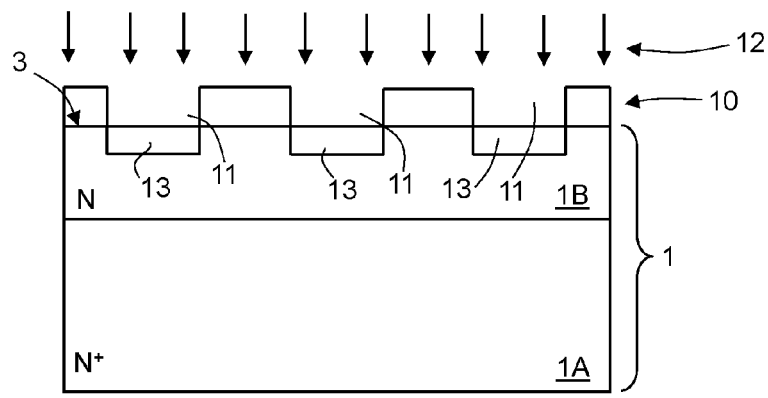
FIGS. 3A to 3H are cross-sections of a semiconductor material die in successive manufacturing steps of the JBS diode of FIG. 1.
Figure 3B:
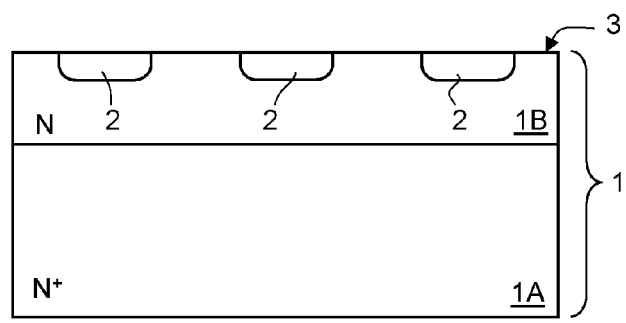
Figure 3C:
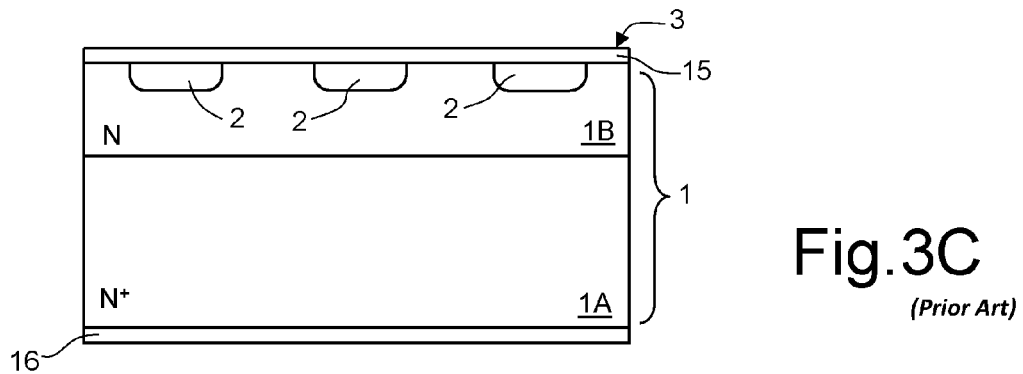

Initially, FIG. 3A, a hard mask 10 having windows 11 is made on the first surface 3 of the body 1. Using the windows 11, an implantation of a P type is carried out, represented schematically by arrows 12, for example, of aluminum ions. Regions of a P type 13 are thus formed.

Next (FIG. 3B), the hard mask 10 is removed and a thermal activation process of the implanted ions is carried out. The process is conducted at a temperature greater than 1500° C. and leads to formation of the implanted regions 2 of FIG. 1. Then, the active area are defined, thereby forming field-oxide regions (not shown), which delimit the area where the JBS diode are to be formed in a per se known manner.

Then (FIG. 3C), a thin masking layer 15 (with a thickness, for example, of approximately 100 nm) is deposited on the first surface 3 of the body 1 and a metal layer is deposited on the second surface 7 to form an ohmic contact on the rear. Then, a thermal process for forming the rear contact metal layer 16 is performed.

Figure 3D:
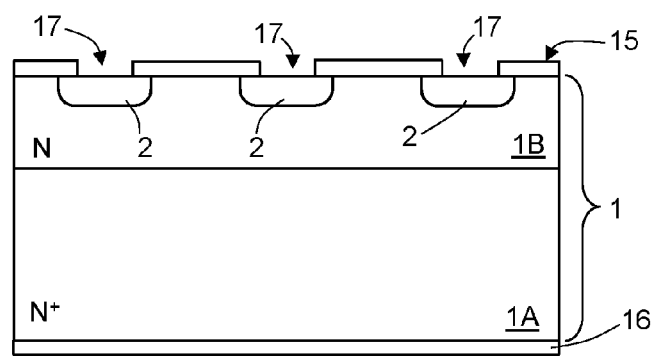

Next, FIG. 3D, the thin masking layer 15 is defined for forming openings 17 over of the implanted regions 2.

Figure 3E:
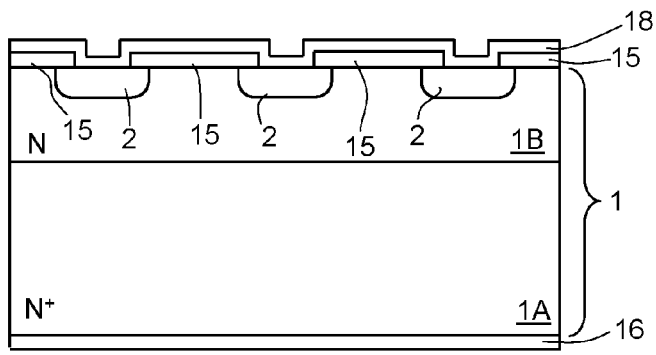
Figure 3F:
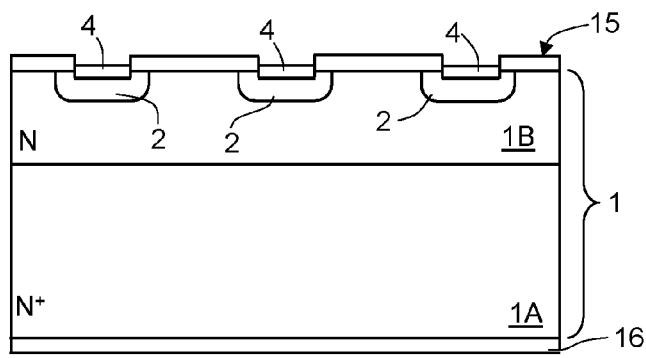
Figure 3G:
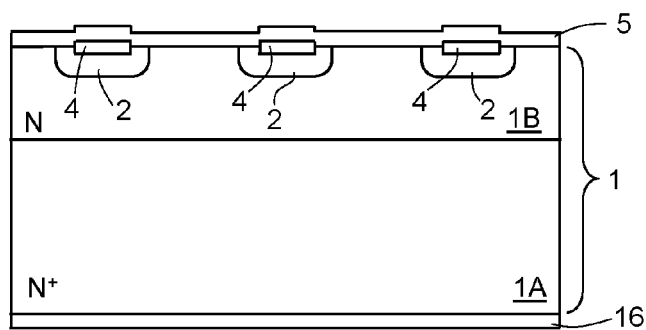
Figure 3H:
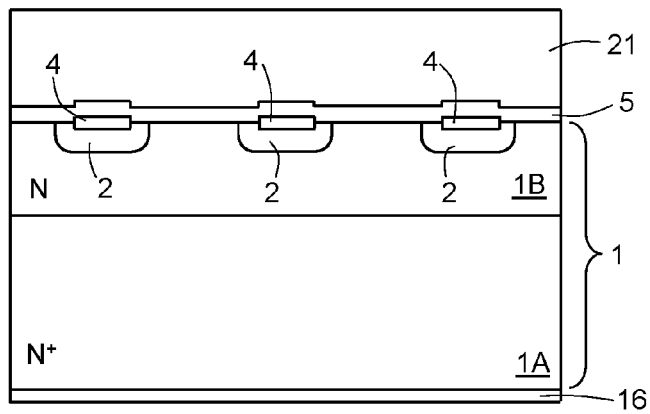

Then, a front contact metal layer 18 is deposited on the first surface 3 (FIG. 3E). The front contact metal layer 18 is, for example, of nickel. Then a thermal process (at a temperature of 900° C.-1000° C.) is performed for forming the ohmic contact regions 4 starting from the front contact metal layer 18 (FIG. 3F). Then, the parts of the front contact metal layer 18 that have not reacted with the semiconductor material of the implanted regions 2 are removed.

Next (FIG. 3G), after a further definition of the active area (not shown), the thin masking layer 15 is removed and the contact metal layer 5, for example of titanium, is deposited on the first surface 3. Then, to optimize control on the process and render it repeatable, a further thermal treatment at a low temperature (lower than 600° C.) is carried out, which stabilizes the metal/semiconductor interface and forms the Schottky barrier.

Finally (FIG. 3H), a thick metal layer 21 is deposited on the contact metal layer 5.

In this way, the Schottky contact (formed, as said, by the portions of the first metal layer 5 in contact with the epitaxial layer 1B) is made after forming the front ohmic contact (ohmic contact regions 4) and does not undergo thermal treatments at a high temperature that would damage it and would not enable reliable operation thereof. On the other hand, the alignment precision for forming the ohmic contact regions 4 on and within the area (in top plan view) of the implanted regions 2, in order to guarantee effective formation of the contact, is increasingly difficult to obtain as the dimensions of the devices decrease.

Figure 4:
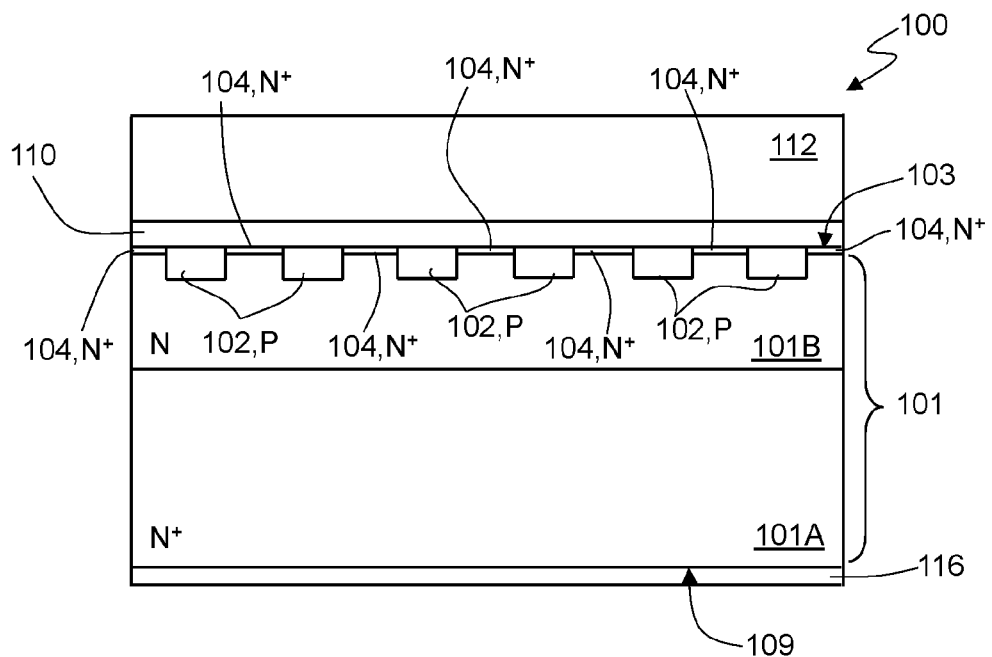
FIG. 4 is a cross-section of the basic physical structure of the present semiconductor device.

FIG. 4 shows an embodiment of a switching device 100 that tackles the problem referred to above. The switching device 100 forms a JBS diode and in general forms part of an integrated device comprising other electronic components (not shown). Consequently, the switching device 100 is generally formed in an active area, delimited by thick field-oxide regions in a per se known manner.

The switching device 100 comprises a substrate 101 of silicon carbide, of an N type. The substrate 101 is also here formed by a substrate 101A and by an epitaxial layer 101B. The substrate 101A and the epitaxial layer 101B may have a thickness and a conductivity having the values referred to above for the homologous layers 1A and 1B. The body 101 has a first surface (e.g., a front surface) 103 and a second surface (e.g., a rear surface) 109. Implanted regions 102 of a P type, arranged at a distance from each other, extend within the epitaxial layer 101B starting from the first surface 103. The implanted regions 102 may extend longitudinally, perpendicular to the drawing plane, strips-like, or may extend along the sides of regular or irregular geometrical figures, such as squares, rectangles, hexagons, circles, etc.

The top portion of the epitaxial layer 101B may be enriched, with respect to the rest of the epitaxial layer 101B (referred to also as body or bulk portion) by a surface layer 104, of an N+ type, as represented in FIG. 4. For instance, in case of an epitaxial layer 101B having a doping level of the order of $10^{16}$ at/cm$^3$, the surface layer 104 may have a doping level higher than $1.5 \cdot 10^{16}$ at/cm$^3$. The depth of the surface layer 104 is lower than the implanted regions 102; for example, the depth of the surface layer 104 is 0.1 μm and the depth of the implanted regions 102 is generally comprised between 0.4 μm and 0.8 μm, for example approximately 0.5 μm.

A first, thinner, metal layer 110 extends over the first surface 103 of the body 101. The first metal layer 110 is formed by a layer of silicide of a transition metal, here nickel, which, at the epitaxial layer 101B between the implanted regions 102, forms Schottky contacts. The first metal layer 110 may have, for example, a thickness comprised between 200 nm and 400 nm. As an alternative to nickel, the first metal layer may also be of cobalt. A second metal layer 112, thicker, extends over the first metal layer 110. The second metal layer 112 is, for example, of aluminum, aluminum-silicon, aluminum-silicon-copper, or copper and has, for example, a thickness comprised between 2 μm and 10 μm (typically, approximately 5 μm).

Furthermore, a rear contact metal layer 116 extends over the second surface 109 of the body 101.

The switching device 100 of FIG. 4 may be obtained as described hereinafter, with reference to FIGS. 5A-5F.

Initially (FIG. 5A), the epitaxial layer 101B, having a top surface 105, is subjected to surface conductivity adjustment. To this end, a blanket, non-masked surface implantation is made, represented in FIG. 5A by the arrows 120. For instance, in the case of the epitaxial layer 101B having a doping of $10^{16}$ at/cm$^3$, dopant atoms of phosphorus or nitrogen at a dose of between $10^{11}$ at/cm$^2$ and $5 \cdot 10^{12}$ at/cm$^2$ may be introduced. The surface layer 104, of an N+ type, is thus formed.

Alternatively, it is possible to use an epitaxial layer 101B with variable conductivity, in which case the most doped area is obtained in the proximity of the top surface 105 during epitaxial growth, according to known technologies, and forms the surface layer 104.

Next (FIG. 5B), a hard mask 121 having windows 122 is formed on the top surface 105 of the body 101. Using the windows 122, an implantation of a P type is carried out, represented schematically by arrows 123, for example of aluminum atoms at a dose of $10^{15}$ at/cm$^3$. Regions 125 of a P type are thus formed.

Then (FIG. 5C), the hard mask 121 is removed and the implanted ions are thermally activated. The process is conducted at a temperature higher than 1500° C. and leads to formation of the implanted regions 102 of FIG. 4. The process parameters are optimized so that the depth of the implanted regions 102 is greater than the surface layer 104, as mentioned. Then the active area is defined, forming field-oxide regions (not shown), which delimit the area where the JBS diode is to be made in a per se known manner.

Next (FIG. 5D), the top surface 105 is covered by a masking layer 126 and a rear metal layer (for example, of nickel) is deposited on the second surface 109 of the body 101 to form an ohmic contact on the rear. Then a thermal process (for example, at a temperature comprised between 900° C. and 1100° C.) is performed, thus forming the rear contact metal layer 116.

After removing the masking layer 126 from the top surface 105 of the body 101 (FIG. 5E) a front contact metal layer, for example of nickel, is deposited thereon. Then, a thermal process is carried out at a temperature of between 550° C. and 700° C., for example 600° C., thereby forming the first metal layer 110, followed by removal of the parts of the front contact metal layer that have not reacted with the semiconductor material of the epitaxial layer 101B. The first metal layer 110 thus forms a continuous layer, having chemical-physical characteristics substantially homogeneous in all directions, apart from possible minor differences of surface roughness. Furthermore, it has a substantially uniform height in the entire area of the switching device 100, without any detectable differences between the implanted regions 102 and the portions of the surface layer 104 that extend between the implanted regions 102.

Finally (FIG. 5F), the second metal layer 111 is deposited on the first metal layer 110.

Figure 6A:
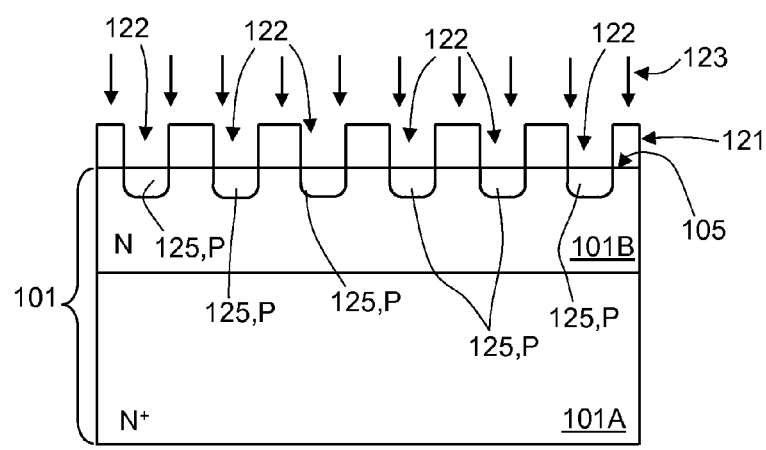
FIGS. 6A and 6B show variants of the manufacturing process steps represented in FIGS. 5A and 5B.
Figure 6B:
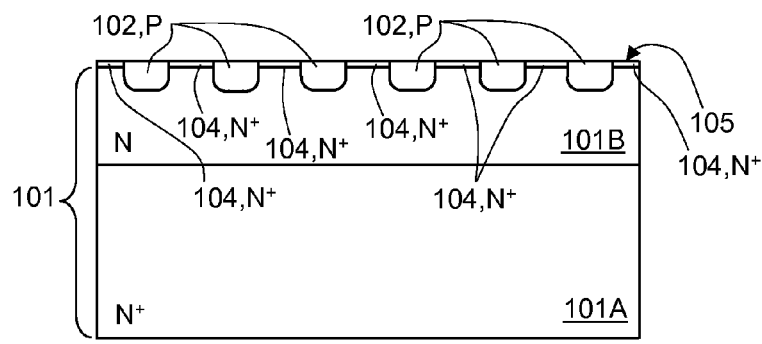

According to a variant shown in FIGS. 6A and 6B, the implantation of the regions 125 of a P type is made prior to implantation of the surface layer 104. To this end, initially (FIG. 6A), the hard mask 121 with windows 122 is formed on the top surface 105 of the epitaxial layer 101B.

Using the windows 122, the regions 125 of a P type are implanted, as represented schematically by the arrows 123.

Figure 5A:
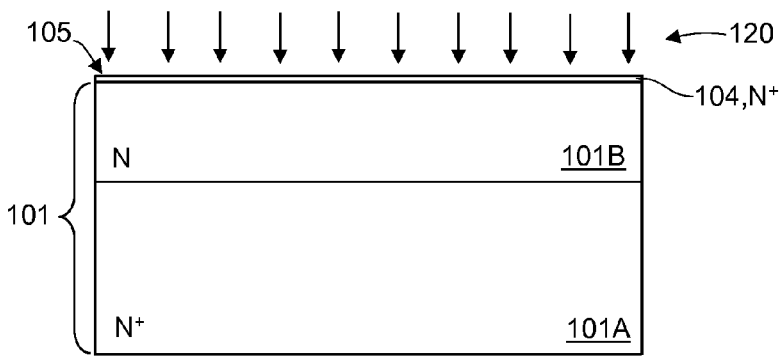
FIGS. 5A to 5F are cross-sections of a semiconductor material die in successive manufacturing steps of the device of FIG. 4, according to an embodiment.
Figure 5B:
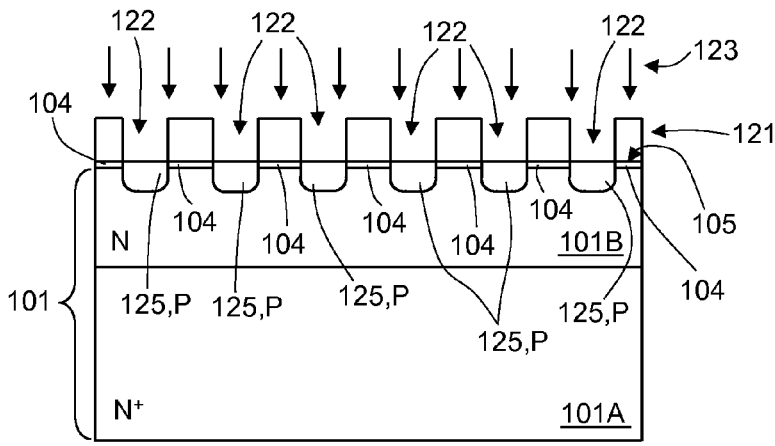
Figure 5C:
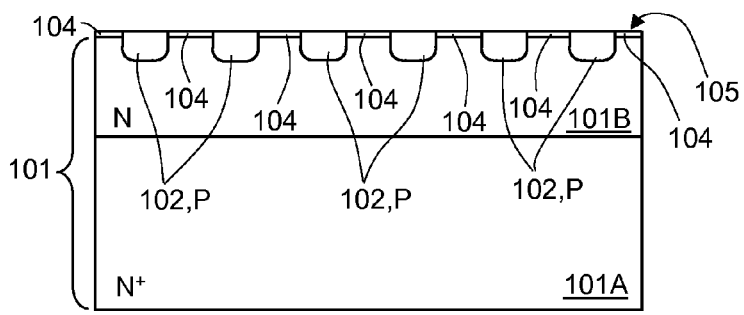
Figure 5D:
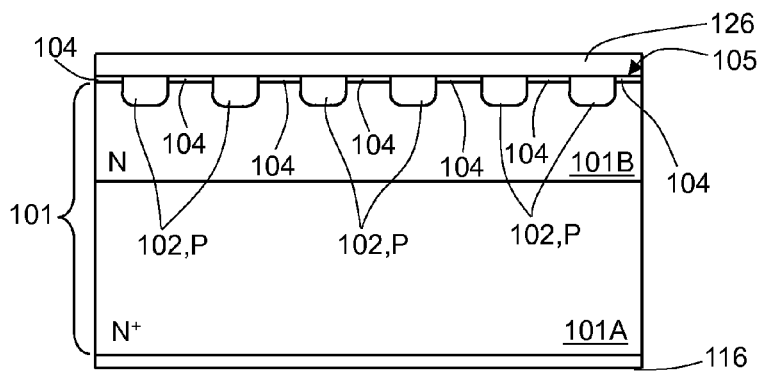
Figure 5E:
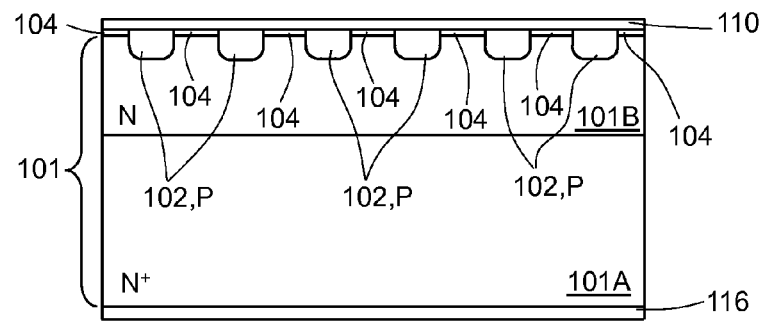
Figure 5F:
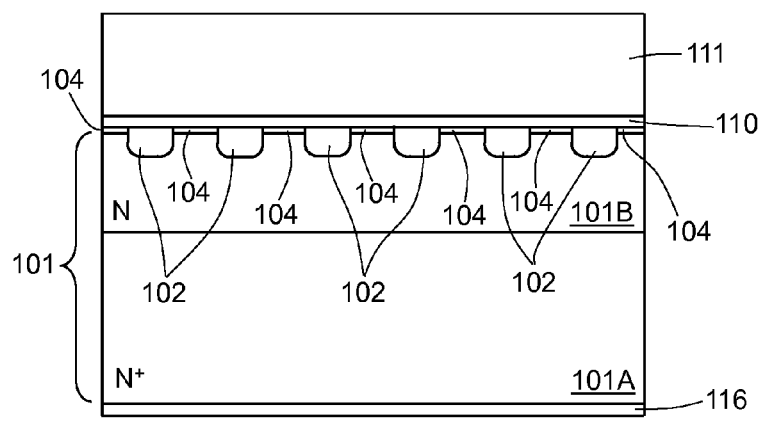

After removing the hard mask 121 (FIG. 6B), the conductivity of the surface area is modified by non-masked implantation. To this end, dopant ions of an N type are implanted in the epitaxial layer 101B near its top surface 105 (as represented schematically by the arrows 120), thus forming the surface layer 104 of an N+ type. An activation step at a temperature higher than 1500° C. is then made, active area are defined and the steps already described with reference to FIGS. 5C-5E are performed.

The described switching device 100 has numerous advantages.

In particular, it has a single layer that forms both the ohmic contact and the Schottky contact at the JBS diode. The fact that a continuous and homogeneous metal layer 110 extends over the entire area of the JBS diode, having a structure and characteristics (in particular, chemical-physical composition) that are uniform in this area, means that the finished device is not subject to limitations linked to the alignment capacity of two successive layers due to the used photo-exposure equipment. In this way, the structure of the switching device 100 may be easily scaled.

Furthermore, the Schottky contact is altogether uniform and stable, since it is obtained by a silicidation as a result of the reaction of the metal with the surface of the body 101 of semiconductor material, to the advantage of the final quality of the device.

The manufacturing process is further simplified by virtue of the deposition of a single metal layer in contact with the body 101 and to the elimination of photolithographic steps for defining the ohmic-contact and Schottky regions. Furthermore, it enables setting of the parameters of the various steps for reaching a compromise between the opposed requirements of the ohmic part and the Schottky part.

In fact, by carrying out the nickel silicidation thermal process at the temperature referred to above of between 550° C. and 700° C., for example approximately 600° C., the contact between the first metal layer 110 and the body 101 is ohmic. By modulating further the surface concentration of the epitaxial layer 101B through the non-masked implantation 120, it is possible to increase the surface electric field and reduce the Schottky barrier appropriately.

In this way, it is possible to obtain a height of the Schottky barrier comprised between 1.2 eV and 1.4 eV, a value similar to the one obtainable with a titanium layer.

Thereby, the switching device 100 may be used in power circuits for voltage classes higher than 1200 V with high efficiency.

Finally, it is clear that modifications and variations may be made to the device and to the manufacturing process described and illustrated herein, without thereby departing from the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A switching device, comprising:
a body of semiconductor material having a substantially planar surface and a bulk portion of a first conductivity type;
implanted switching regions of a second conductivity type, the implanted switching regions extending in the body to a first depth from the surface;
non-masked implanted surface portions extending in the body to a second depth from the surface, the second depth being less than the first depth, the implanted surface portions extending between respective pairs of the implanted switching regions and having the first conductivity type, the implanted surface portions having a higher conductivity level than the bulk portion and being sandwiched between and delimited by the respective pairs of the implanted switching regions;
Schottky contact metal portions on the surface and in direct contact with the implanted surface portions; and
ohmic contact metal portions on the surface and in direct contact with the implanted switching regions,
wherein the Schottky contact metal portions and the ohmic contact metal portions are respective portions of a first metal layer having homogeneous chemical-physical characteristics, said first metal layer being a single, continuous layer over the implanted surface portions and implanted switching regions.

2. The switching device according to claim 1, wherein the first metal layer is a silicide of a transition metal.

3. The switching device according to claim 1, wherein the first metal layer is formed by a silicide chosen between nickel silicide and cobalt silicide.

4. The switching device according to claim 1, wherein the body is of silicon carbide.

5. The switching device according to claim 1, wherein the body comprises an epitaxial layer and the implanted surface portions have a depth smaller than the implanted switching regions and are positioned in the epitaxial layer.

6. The switching device according to claim 1, wherein the first conductivity is of an N type and the second conductivity is of a P type.

7. The switching device according to claim 1, wherein the first metal layer has a first thickness and the switching device includes a second metal layer overlying the first metal layer and having a second thickness greater than the first thickness.

8. The switching device according to claim 1, wherein the switching device is a junction-barrier Schottky diode.

9. A process for manufacturing a switching device, comprising:
in a body of semiconductor material having a bulk portion, a substantially planar surface and a first conductivity type, forming implanted switching regions of a second conductivity type extending in the body to a first depth from the surface;
forming non-masked implanted surface portions of the body extending in the body to a second depth from the surface, the second depth being less than the first depth, the implanted surface portions extending between respective pairs of the implanted switching regions and having the first conductivity type, the implanted surface portions having a higher conductivity level than the bulk portion and being sandwiched between and delimited by the respective pairs of the implanted switching regions; and forming, over the surface, a contact metal layer having homogeneous chemical-physical characteristics, the contact metal layer having Schottky contact metal portions in direct contact with the implanted surface portions of the body and ohmic contact metal portions in direct contact with the implanted switching regions, said contact metal layer being a single, continuous layer over the implanted surface portions and implanted switching regions.

10. The process according to claim 9, wherein forming the contact metal layer comprises depositing a transition metal layer on the body and carrying out a thermal treatment and reacting the transition metal with the semiconductor material of the body.

11. The process according to claim 10, wherein carrying out the thermal treatment and reacting is carried out at a temperature comprised between 550° C. and 700° C., for example 600° C.

12. The process according to claim 9, wherein the contact metal layer is one of nickel and cobalt.

13. The process according to claim 9, wherein the body comprises an epitaxial layer under the surface and overlying the bulk portion, the implanted surface portions being formed in the epitaxial layer.

14. The process according to claim 13, wherein forming the implanted surface portions comprises implanting dopant ion species before forming the implanted switching regions.

15. The process according to claim 9, wherein the body is of silicon carbide.

16. The switching device according to claim 1, wherein the first metal layer has a substantially uniform height over the implanted surface portions and implanted switching regions.

17. The switching device of claim 1, wherein the implanted switching regions include mask-implanted switching regions, and the implanted surface portions include blanket implanted surface portions.

18. A switching device, comprising:
a body of semiconductor material having a substantially planar surface and a bulk portion of a first conductivity type;
implanted switching regions of a second conductivity type, the implanted switching regions extending in the body to a first depth from the surface;
non-masked implanted surface portions extending in the body to a second depth from the surface, the second depth being less than the first depth, the implanted surface portions extending between respective pairs of the implanted switching regions and having the first conductivity type, the implanted surface portions having a higher conductivity level than the bulk portion and being sandwiched between and delimited by the respective pairs of the implanted switching regions; and
a first metal layer contacting the implanted surface portions and the implanted switching regions, the first metal layer being a single, continuous layer over the implanted surface portions and the implanted switching regions,
wherein the implanted surface portions and the first metal layer form respective Schottky barriers having a height between 1.2 eV and 1.4 eV.

19. The switching device of claim 18, wherein the first metal layer forms Schottky contact metal portions over the implanted surface portions, and forms ohmic contact metal portions over the implanted switching regions.

20. The switching device of claim 18, further comprising a second metal layer overlying the first metal layer, the second metal layer having a thickness that is greater than a thickness of the first metal layer.

\* \* \* \* \*